United States Patent
Ryu et al.

(10) Patent No.: US 12,519,306 B2
(45) Date of Patent: Jan. 6, 2026

(54) COOLING CONTROL APPARATUS FOR SUPERCONDUCTING FAULT CURRENT LIMITER

(71) Applicant: LS ELECTRIC CO., LTD., Anyang-si (KR)

(72) Inventors: Ki Nam Ryu, Anyang-si (KR); Dong Jin Yun, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 184 days.

(21) Appl. No.: 18/281,909

(22) PCT Filed: Feb. 14, 2022

(86) PCT No.: PCT/KR2022/002153
§ 371 (c)(1),
(2) Date: Sep. 13, 2023

(87) PCT Pub. No.: WO2022/196952
PCT Pub. Date: Sep. 22, 2022

(65) Prior Publication Data
US 2024/0222960 A1 Jul. 4, 2024

(30) Foreign Application Priority Data
Mar. 19, 2021 (KR) .................. 10-2021-0035775

(51) Int. Cl.
*H02H 9/02* (2006.01)
*H05K 7/20* (2006.01)
*H10N 60/30* (2023.01)

(52) U.S. Cl.
CPC ......... *H02H 9/023* (2013.01); *H05K 7/20236* (2013.01); *H10N 60/30* (2023.02)

(58) Field of Classification Search
CPC ............ H02H 9/02; H02H 9/023; H05K 7/20; H05K 7/20236; H10N 60/30; F25B 19/00; H01F 6/04
(Continued)

(56) References Cited

U.S. PATENT DOCUMENTS

| 2005/0111159 A1* | 5/2005 | Knight ............... G01R 33/3815 361/143 |
| 2007/0204632 A1* | 9/2007 | Lee .......................... F25D 3/10 62/51.1 |

(Continued)

FOREIGN PATENT DOCUMENTS

| JP | 2009267273 A | 11/2009 |
| JP | 5017640 B2 | 9/2012 |

(Continued)

OTHER PUBLICATIONS

Notice of Allowance for related Korean Application No. 10-2021-0035775; action dated Dec. 23, 2023; (6 pages).

(Continued)

*Primary Examiner* — Danny Nguyen
(74) *Attorney, Agent, or Firm* — K&L Gates LLP (57) ABSTRACT

The present disclosure relates to a cooling control device for a superconducting fault current limiter, the cooling control device comprising a superconducting fault current limiter for cooling a saturated liquid coolant with a freezer to maintain a temperature of a subcooled liquid coolant in which a superconducting element is immersed, a pressure sensor for detecting a pressure of a second container in which the saturated liquid coolant of the superconducting fault current limiter is accommodated, and a control unit for estimating a temperature of the saturated liquid coolant by using a result of detecting the pressure of the pressure sensor, and controlling a temperature of the freezer depend- (Continued)

ing on the estimated temperature of the saturated liquid coolant.

4 Claims, 6 Drawing Sheets

(58) Field of Classification Search
USPC .......................................................... 361/19
See application file for complete search history.

(56) References Cited

U.S. PATENT DOCUMENTS

| | | | |
|---|---|---|---|
| 2009/0241558 A1* | 10/2009 | Yuan | .................. H01F 6/04 |
| | | | 62/51.1 |
| 2016/0233011 A1 | 8/2016 | Eguchi | |
| 2017/0205124 A1* | 7/2017 | Staines | ............... F25B 19/005 |

FOREIGN PATENT DOCUMENTS

| | | |
|---|---|---|
| JP | 2017537296 A | 12/2017 |
| KR | 20120056693 A | 6/2012 |
| KR | 20130033062 A | 4/2013 |
| KR | 20140133476 A | 11/2014 |
| KR | 20220130924 A | 9/2022 |

OTHER PUBLICATIONS

International Search Report for related International Application No. PCT/KR2022/002153; action dated Sep. 22, 2022; (2 pages).
Written Opinion for related International Application No. PCT/KR2022/002153; action dated Sep. 22, 2022; (3 pages).

* cited by examiner

COOLING CONTROL APPARATUS FOR SUPERCONDUCTING FAULT CURRENT LIMITER

CROSS-REFERENCE TO RELATED APPLICATION

This application is a National Stage of International Application No. PCT/KR2022/002153, filed on Feb. 14, 2022, which claims priority to and the benefit of Korean Patent Application No. 10-2021-0035775, filed on Mar. 19, 2021, the disclosures of which is incorporated herein by reference in its entirety.

FIELD

The present disclosure relates to cooling control device for a superconducting fault current limiter, and more particularly, to a cooling control device for a non-circulating superconducting fault current limiter.

BACKGROUND

In general, various power system stabilizers for controlling fault current have been proposed.

Among them, the superconducting fault current limiter means a device that injects impedance into the power system by using the superconductivity of superconductors to limit the capacity of a breaker to block when a fault current occurs.

The superconductor applied to the superconducting fault current limiter exhibits zero resistance property at a certain temperature and a certain current or less, and exhibits a high resistance as the superconductivity thereof is destroyed and thus transitioned to a phase-conduction state when an unexpected accident occurs in the power system.

Therefore, the fault current may be lowered by changing the resistance property of the superconductor depending on its temperature or current.

For the basic operation of a superconducting fault current limiter as described above, in normal operation, the superconductor of the superconducting fault current limiter should be cooled by a cooling apparatus and maintained in a superconducting state.

Korean Patent No. 10-1104234 (Publication Date: Jan. 10, 2012; Title of Disclosure: Apparatus and Method for Controlling Internal Temperature of Superconducting Fault Current Limiter), which was registered on Jan. 3, 2012, as a patent, discloses a configuration of cooling a superconducting element-immersed liquid nitrogen with using a freezer and a conduction cooling copper band to maintain its temperature.

Since a temperature difference occurs in the copper band itself as the length of the copper band increases, however, the operation temperature of the freezer is only lowered in order to obtain an overall sufficient cooling effect, which increases the power consumption of the freezer.

That is, the performance and efficiency of the freezer decreases as the temperature decreases. For example, the power consumption for lowering absolute temperature from 60 K to 50 K increases by about 20% compared to the power consumption for lowering from 80 K to 70 K.

Also, Korean Laid-open Patent Publication No. 10-2008-0102157 (Title of Disclosure: Multi-Bath Apparatus and Method for Cooling Superconductor; Publication Date: Nov. 24, 2008) describes another configuration of a cooling apparatus for maintaining the temperature of a superconducting element.

In the above laid-open patent publication, the cooling apparatus comprises a cooling bath for cooling the superconductor and a shield bath surrounding the cooling bath, in which its pressure is controlled to overcool the cooling bath and to maintain the shield bath in a saturation state.

The freezer is positioned at an inner upper portion of the shield bath. The freezer is not contacted with liquid nitrogen in the shield bath and, the freezer is responsible for re-liquefying the saturated liquid nitrogen from its gas phase-changed state.

In addition, in the above laid-open patent publication, the cooling apparatus comprises a configuration in which a cryogenic storage tank is separately provided, and the liquid nitrogen is supplied to the shield bath to compensate for a liquid level of the shield bath.

The prior art having such above configurations has a problem in that a spatial and cost loss occurs due to operation of the cryogenic storage tank for storing liquid nitrogen.

In addition, in order to operate the conventional superconducting fault current limiter, a temperature sensor for directly detecting a subcooled temperature of the cooling bath and a temperature of the saturation state of the shield bath is provided, and the freezer is controlled depending on the detected temperature.

However, since the temperature sensor for detecting the cryogenic temperature is expensive, there is a problem that the manufacturing cost of the superconducting fault current limiter increases, and the maintenance and repair of the temperature sensor located in a sealed space is not easy.

In addition, since the temperature sensor is immersed in liquid nitrogen and the signal line of the temperature sensor has to be extended outside the superconducting fault current limiter, it is not easy to maintain the pressure inside the superconducting fault current limiter.

SUMMARY

The present disclosure has been made in view of the above problems, and an object of the present disclosure is to provide a cooling control device for a superconducting fault current limiter capable of detecting a temperature of a saturated liquid coolant using a low-cost means.

Specifically, the present disclosure provides a cooling control device for a superconducting fault current limiter capable of estimating the temperature of the saturated liquid coolant by detecting an internal pressure of the superconducting fault current limiter without directly detecting the temperature of the saturated liquid coolant.

In addition to the above objects, another object of the present disclosure is to provide a cooling control device for a superconducting fault current limiter capable of easily maintaining and repairing and advantageous in maintaining pressure.

Another object of the present disclosure is to provide a cooling control device for a superconducting fault current limiter capable of providing redundancy for temperature detection using a temperature sensor that directly detects the temperature of the saturated liquid coolant.

Another object of the present disclosure is to provide a cooling control device for a superconducting fault current limiter capable of securing temperature uniformity in cooling a superconducting element by activating the circulation of a subcooled liquid coolant to secure temperature uniformity.

In addition, another object of the present disclosure is to provide a cooling device of a superconducting fault current limiter that is very advantageous in maintaining the pressure of the first container containing the subcooled liquid coolant.

The cooling control device for a superconducting fault current limiter according to the present disclosure may include a superconducting fault current limiter for cooling a saturated liquid coolant with a freezer to maintain a temperature of a subcooled liquid coolant in which a superconducting element is immersed; a pressure sensor for detecting a pressure of a second container in which the saturated liquid coolant of the superconducting fault current limiter is accommodated; and a control unit for estimating a temperature of the saturated liquid coolant by using a result of detecting the pressure of the pressure sensor, and controlling a temperature of the freezer depending on the estimated temperature of the saturated liquid coolant.

The present disclosure includes a first container for accommodating a subcooled liquid coolant, and a second container for surrounding the outside of the first container and accommodating a saturated liquid coolant, estimates a temperature of the saturated liquid coolant by detecting an internal pressure of the second container, thereby reducing costs, facilitates maintenance and repair, and has an advantage in maintaining the internal pressure of the second container.

In addition, the present disclosure has an effect of activating circulation in the first container due to a partial temperature difference of the subcooled liquid coolant by positioning the second container in contact with only an upper side of lateral surface of the first container, thereby securing a temperature uniformity of the superconducting element.

In addition, the present disclosure sets a liquid level of the saturated liquid coolant in the second container to be higher than that of the subcooled liquid coolant in the first container, so that a wall surface of the first container acts as a condensation surface, thereby being advantageous in maintaining the internal pressure of the first container.

In addition, the present disclosure has an effect of minimizing the use of a temperature sensor capable of detecting a cryogenic temperature by detecting an internal pressure of the first container and converting the detected pressure into a temperature, thereby reducing a cost, and also has an effect of simplifying a complicated configuration for insertion and sealing of the temperature sensor, which is advantageous in maintenance and improving a pressure maintenance performance.

DESCRIPTION-NUMBERED 10 first container
11 superconducting element
12 subcooled liquid coolant
13 condensing surface
20 second container
21 saturated liquid coolant
30 third container
31 vacuum
40 freezer
50 pressure sensor
60 control unit
61 processor
62 analog-to-digital converter
63 memory
64 temperature controller

DETAILED DESCRIPTION

To fully understand the constitution and effects of the present disclosure, the preferred embodiments of the present disclosure will be described with reference to the accompanying drawings. However, the present disclosure is not limited to the embodiments disclosed below, and may be implemented in various ways and various modifications may be added thereto. The description on the embodiments of the present disclosure is provided merely to make the disclosure of the present disclosure complete, and to fully inform a person skilled in the art of the present disclosure. In the accompanying drawings, constitutive elements are shown to enlarge their size than the actual size for convenience of description, and the ratio of each constitutive elements may be exaggerated or reduced.

As used herein, terms such as 'first', 'second', etc., may be used to describe various components, but the components should not be limited by the above terms. The above terms may be used only to distinguish one component from another. For example, 'first component' may be referred to as 'second component', and similarly, 'second component' may be referred to as 'first component' without departing from the scope of the present disclosure. In addition, singular expressions may include plural expressions unless the context clearly dictates otherwise. The terms used in the embodiments of the present disclosure may be interpreted as a meaning commonly known to a person skilled in the art unless otherwise defined.

Hereinafter, a cooling control device for a superconducting fault current limiter according to an embodiment of the present disclosure will be described in detail with reference to the accompanying drawings.

Figure 1:
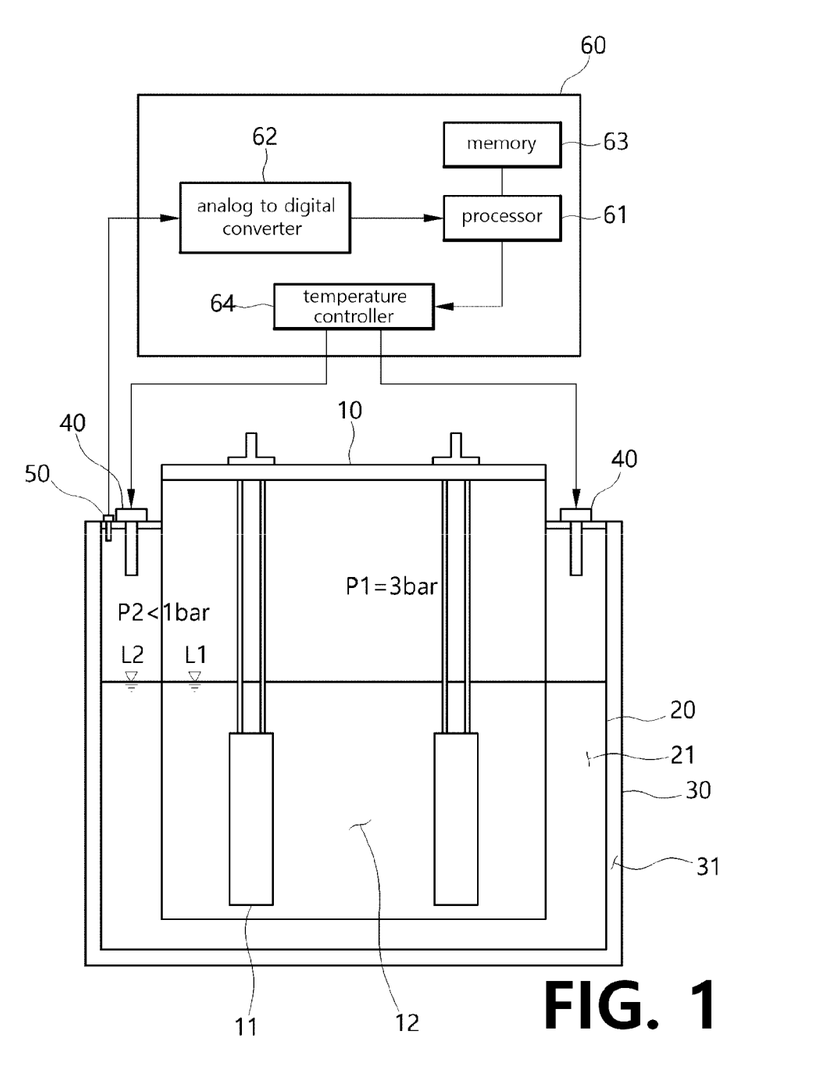
FIG. 1 is a block diagram of a cooling control device for a superconducting fault current limiter according to a preferred embodiment of the present disclosure.

FIG. 1 is a cross-sectional block diagram of a cooling apparatus for a superconducting fault current limiter according to a preferred embodiment of the present disclosure.

Referring to FIG. 1, the present disclosure includes a first container 10 accommodating a subcooled liquid coolant 12 in which a superconducting element 11 is immersed, a second container 20 positioned in contact with an outer surface of the first container 10 to cover a lateral surface and a bottom surface of the first container 10, and accommodating a saturated liquid coolant 21, a third container 30 in contact with a lateral surface and a bottom surface of the first container 10 and the second container 20, a freezer 40 inserted into the second container 20 and condensing the vaporized saturated liquid coolant 21, a pressure sensor 50 for detecting a pressure of the second container 20, and a control unit 60 for receiving the pressure detection result of the pressure sensor 50, estimating a temperature of the saturated liquid coolant 21 of the second container 20 and adjusting a temperature of the freezer 40.

Hereinafter, the superconducting fault current limiter cooling control device according to the present disclosure configured as described above will be described in more detail in relation to its configuration and operation.

First, the first container 10 provides a cylindrical accommodation space, and a superconducting element 11 is provided inside. The superconducting element 11 may be provided in the same number as the number of phases of the power system.

That is, three superconducting elements 11 may be used for a three-phase power system.

The superconducting element 11 is immersed into the subcooled liquid coolant 12 in the first container 10, and its temperature is maintained by the subcooled liquid coolant 12 to maintain a resistance close to zero in a state before a fault current is generated.

The subcooled liquid coolant 12 may be liquid nitrogen.

The internal pressure P1 of the first container 10 is 3 bar, and the subcooled liquid coolant 12 has a temperature of 77 K as a normal reference temperature.

In order to maintain the internal pressure P1 of the first container 10, a non-condensing gas is injected thereinto. Examples of the non-condensed gas include gaseous neon and helium, and the upper side space of the subcooled liquid coolant 12 of the first container 10 may be understood as maintaining its pressure by filling gas mixed with gaseous neon or helium.

The subcooled liquid coolant 12 accommodated in the first container 10 is not exchanged for another and maintains its temperature in the installation state, unless there is a special reason.

The temperature of the subcooled liquid coolant 12 in the first container 10 is maintained by the action of the saturated liquid coolant 21 with the freezer 40 in the second container 20.

The pressure P2 of the second container 20 is maintained at less than 1 bar, and the temperature of the saturated liquid coolant 21 needs to be maintained at a temperature of less than 77 K. The saturated liquid coolant 21 may also use liquid nitrogen.

The temperature of the saturated liquid coolant 21 is preferably 75 to 76 K.

The inner wall of the second container 20 may be advantageous for heat exchange by using a portion of the outer wall of the first container 10 as it is.

The liquid level of the saturated liquid coolant 21 accommodated in the second container 20 may be the same as the liquid level of the subcooled liquid coolant 12 accommodated in the first container 10, and other examples will be described in more detail below.

A plurality of freezers 40 are coupled to one surface, for example, an upper surface of the second container 20, and cold heads of the freezers 40 are introduced into the second container 20.

Accordingly, heat exchange is performed between the saturated liquid coolant 21 of the second container 20 and the subcooled liquid coolant 12 of the first container 10, and the heat exchange at this time is performed through a portion of the outer wall of the first container 10 between the saturated liquid coolant 21 and the subcooled liquid coolant 12.

A portion of the saturated liquid coolant 21 is vaporized by the heat exchange, and the subcooled liquid coolant 12 maintains its temperature.

The vaporized saturated liquid coolant 21 is condensed by the freezer 40 again to be liquefied, and the liquefied liquid falls by gravity to be mixed with the saturated liquid coolant 21 repeatedly.

Accordingly, the present disclosure may maintain the temperature of the subcooled liquid coolant 12 and the superconducting element 11 without circulating the saturated liquid coolant 21.

That is, the temperature of the saturated liquid coolant 21 must be maintained at the temperature lower than the temperature of the subcooled liquid coolant 12, wherein the temperature of the saturated liquid coolant 21 is detected to appropriately control the freezer 40.

To this end, the present disclosure detects the internal pressure P2 of the second container 20 using the pressure sensor 50.

The pressure detection result of the pressure sensor 50 is provided to the control unit 60.

The control unit 60 includes an analog-to-digital converter 62 for converting an analog output of the pressure sensor 50 into a digital signal, a memory 63 for storing a correlation data table of pressure and temperature, a processor 61 for receiving pressure information of the analog-to-digital converter 62 and estimating the temperature of the saturated liquid coolant 21 using the table stored in the memory 63, and a temperature controller 64 for controlling the temperature of the freezer 40 under the control of the processor 61.

In this configuration, the pressure temperature correlation data table stored in the memory 63 uses a phase diagram of the saturated liquid coolant.

Figure 2:
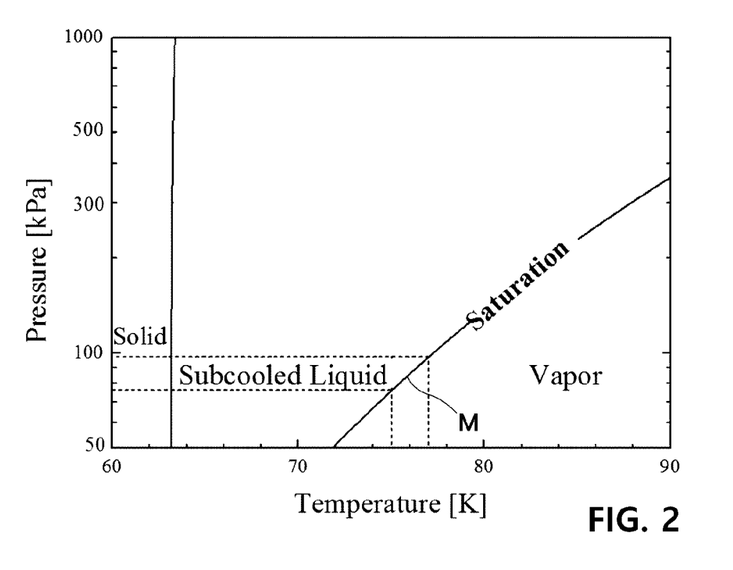
FIG. 2 is a saturation diagram.

FIG. 2 shows a saturation diagram of liquid nitrogen, which is an example of the saturated liquid coolant 21.

Referring to FIG. 2, the phase of the saturated liquid coolant 21 is differently determined according to the temperature and pressure. In general, liquid nitrogen becomes saturated at a pressure of 70 to 90 kPa (0.7 to 0.9 bar) at a temperature of 75 to 76 K. That is, the temperature and pressure should be determined along the section M of the saturation diagram in the drawing.

The saturated liquid coolant 21 remains saturated, and vaporizes when the temperature is increased by heat exchange with the subcooled liquid coolant 12.

At this time, when the temperature of the saturated liquid coolant 21 becomes higher than the above range, vaporization occurs actively, and the pressure inside the second container 20 increases.

Conversely, when the temperature of the freezer 40 is too low, condensation of vaporized liquid nitrogen occurs more actively, and the pressure inside the second container 20 decreases.

Therefore, a correlation between the temperature of the saturated liquid coolant 21 and the internal pressure of the second container 20 is established, and the temperature may be estimated according to the pressure-temperature correlation by detecting the pressure P2 of the second container 20.

The processor 61 detects a temperature indicated by the detected pressure using the pressure-temperature correlation data table stored in the memory 63 and control to raise or lower the temperature of the freezer 40 according to the detected temperature.

That is, the processor 61 may control the temperature controller 64 to control the temperature of the freezer 40, thereby adjusting the degree of condensation of the vaporized liquid nitrogen to maintain the pressure P2.

At this time, the maintenance of the pressure P2 is then related to the temperature of the freezer 40, and the temperature of the saturated liquid coolant 21 is also determined depending on the temperature of the freezer 40.

As described above, the present disclosure may reduce costs by estimating the temperature of the saturated liquid coolant 21 by detecting the pressure P2 without directly detecting the temperature of the saturated liquid coolant 21.

In addition, since the pressure sensor 50 is not immersed in the saturated liquid coolant 21 and has a structure that can be easily replaced in a part of the second container 20, it is easy to maintain and repair, thereby improving the reliability and convenience of operating the fault current limiter.

In addition, the present disclosure may further include a temperature sensor immersed in the saturated liquid coolant 21 together with the pressure sensor 50, and may be operated in a redundancy structure.

In this case, although the cost increases, there is an advantage in that normal temperature control is possible even when an error occurs in the temperature sensor and that the temperature detected by the temperature sensor can be verified.

Figure 3:
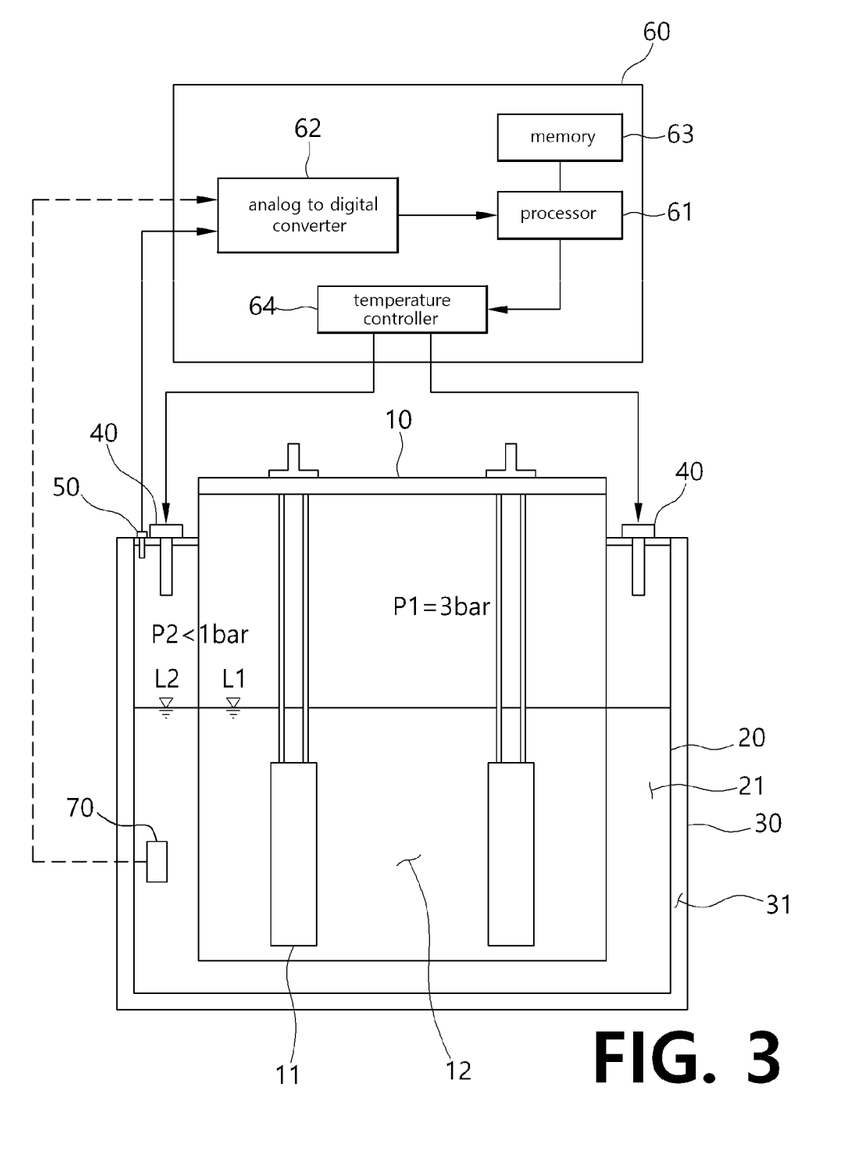
FIG. 3 is a block diagram of another embodiment of the present disclosure including a temperature sensor.

FIG. 3 illustrates a cooling control apparatus of a superconducting fault current limiter of the present disclosure including a temperature sensor 70.

As such, both the pressure sensor 50 for detecting the internal pressure of the second container 20 and the temperature sensor 70 for directly detecting the temperature of the saturated liquid coolant 21 filled in the second container 20 may be used.

As mentioned above, the temperature of the saturated liquid coolant 21 may be detected using the temperature sensor 70, and the operation of the freezer 40 may be controlled according to the detection result.

In this case, the result of converting the pressure in the second container 20 detected by the pressure sensor 50 into temperature is compared with the temperature detected by the temperature sensor 70, and if there is a difference in the set value or more, the temperature sensor 70 may be determined to be abnormal.

The temperature controller 64 may control a heater (not shown) for heating the second container 20 as well as the freezer 40, and may adjust the temperature of the saturated liquid coolant 21 to a normal range using the heater when the temperature of the saturated liquid coolant 21 is lower than the set temperature.

Figure 4:
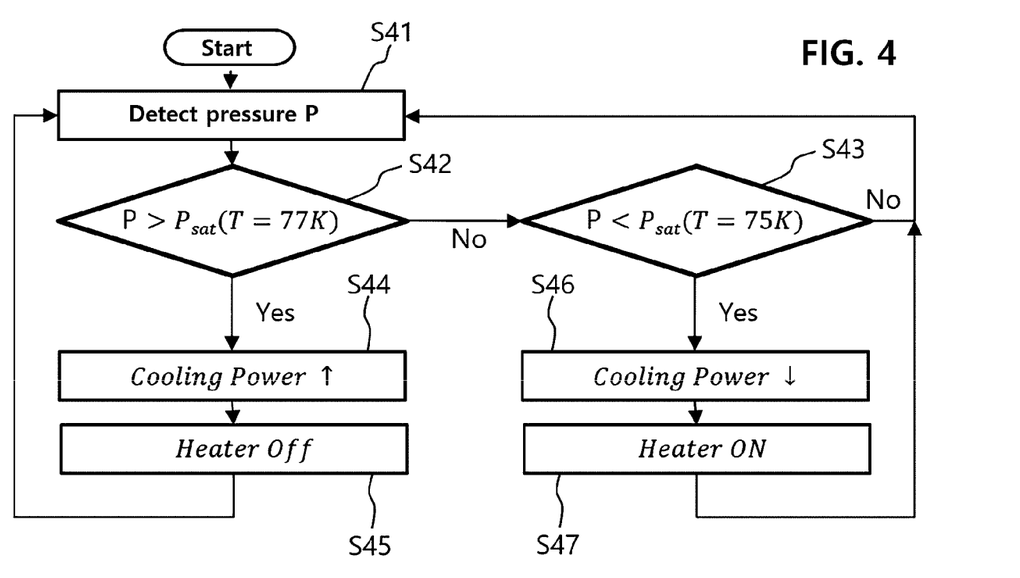
FIG. 4 is a flowchart of operation of the present disclosure.

FIG. 4 is a flowchart of operation of the present disclosure.

As shown in FIG. 4, the pressure P in the second container 20 is detected using the pressure sensor 50 (Step 41).

The detected pressure P is converted into a digital signal via an analog-to-digital converter 62 and provided to the processor 61.

At this time, the processor 61 compares the detected pressure P with the saturation pressure $P_{sat}$ as in Step 42 and Step 43. The saturation pressure $P_{sat}$ is the pressure at the temperature T in the range of 75 to 77K, and it is determined whether the detected pressure P is greater than the pressure when the temperature is 77K as in Step 42.

When the detected pressure P is greater than the saturation pressure at 77K, a cooling power of the temperature controller 64 is increased as in Step 44, and operation of a heater is stopped as in Step 45.

As a result of the determination in Step 42, if the detected pressure P is smaller than the saturation pressure at 77K, it is determined whether the detected pressure P is smaller than the saturation pressure at 75K as in Step 43, and if not smaller, return to Step 41.

Figure 5:
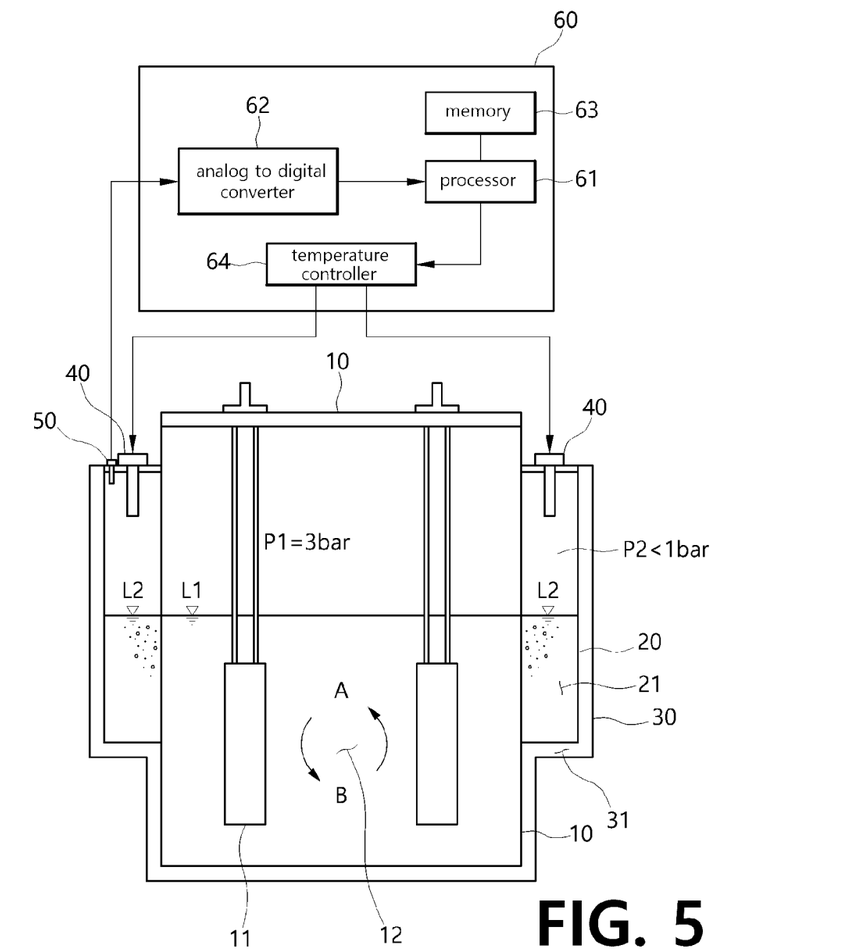
FIGS. 5 and 6 are block diagrams of a cooling control device for a superconducting fault current limiter according to another embodiment of the present disclosure.

If it is smaller, the temperature controller 64 lowers the cooling power of the freezer 40 and operates the heater as in Step 46 and Step 47 to adjust the temperature of the saturated liquid coolant 21 in the range of 75 to 77K. FIG. 5 is a block diagram of a cooling control device for a superconducting fault current limiter according to another embodiment of the present disclosure.

Referring to FIG. 5, the second container 20 may be configured to be positioned only on an upper side of the lateral surface of the first container 10.

That is, the second container 20 is positioned to expose a lower side of lateral surface and a bottom surface of the first container 10, and thus heat exchange with the saturated liquid coolant 21 occurs on the lateral surface side of the subcooled liquid coolant 12 accommodated in the first container 10.

The second container 20 may cover about 50% of the height of the lateral surface from the upper end of the lateral surface of the first container 10 downward. More specifically, the second container 20 may cover 40 to 60%.

The second container 20 has a ring-type structure for exposing the lower part of the lateral surface of the first container 10 and the bottom surface thereof, and provides an inner space of the same type.

The inner wall of the second container 20 may be advantageous for heat exchange by using a portion of the outer wall of the first container 10 as it is.

The liquid level of the saturated liquid coolant 21 accommodated in the second container 20 may be the same as the liquid level of the subcooled liquid coolant 12 accommodated in the first container 10, and other examples will be described in more detail below.

A plurality of freezers 40 are coupled to one surface, for example, an upper surface of the second container 20, and cold heads of the freezers 40 are introduced into the second container 20.

Accordingly, heat exchange is performed between the saturated liquid coolant 21 of the second container 20 and the subcooled liquid coolant 12 of the first container 10, and the heat exchange at this time is performed through a portion of the outer wall of the first container 10 between the saturated liquid coolant 21 and the subcooled liquid coolant 12.

A portion of the saturated liquid coolant 21 is vaporized by the heat exchange, and the subcooled liquid coolant 12 maintains its temperature.

The vaporized saturated liquid coolant 21 is condensed by the freezer 40 again to be liquefied, and the liquefied liquid falls by gravity to be mixed with the saturated liquid coolant 21 repeatedly.

The subcooled liquid coolant 12 of the first container 10 mainly generates heat exchange at the upper side covered by the second container 20. In FIG. 3, region A is an upper layer region in which heat exchange is performed with the saturated liquid coolant 21 of the second container 20, and the lower layer region B does not generate heat exchange.

However, the temperature of the subcooled liquid coolant 12 in the lower layer region B is relatively higher than that of the subcooled liquid coolant 12 in the upper layer region A, and thus a convection occurs between the upper layer region A and the lower layer region B.

That is, the present disclosure restricts the contact surface of the second container and the first container 10 to its portion, and induces a partial thermal imbalance in the subcooled liquid coolant 12 in the first container 10 according to the heat exchange, thereby forming convection.

The formation of such convection causes the subcooled liquid coolant 12 in the first container 10 to circulate amongst itself to achieve temperature equilibrium, and is thus characterized by increased temperature uniformity.

Such temperature uniformity may allow the superconducting element 11 to be cooled to a uniform temperature as a whole, and resistance uniformity of the superconducting element 11 itself may be also secured by securing the temperature uniformity of the superconducting element 11.

The third container 30 has a structure enclosing both the lateral surface and the bottom surface of the second container 20 and the exposed lateral surface and the bottom surface of the first container 10, and the inner side is vacuumed 31 to block heat transfer, which is advantageous for maintaining the temperature of the subcooled liquid coolant 12 and the saturated liquid coolant 21 of the first container 10 and the second container 20.

In this configuration, the configuration and operation of detecting the pressure of the second container 20 using the pressure sensor 50 and controlling the freezer 40 by estimating the temperature by the detected pressure are directly applied to the configuration and operation described with reference to FIG. 1.

Figure 6:
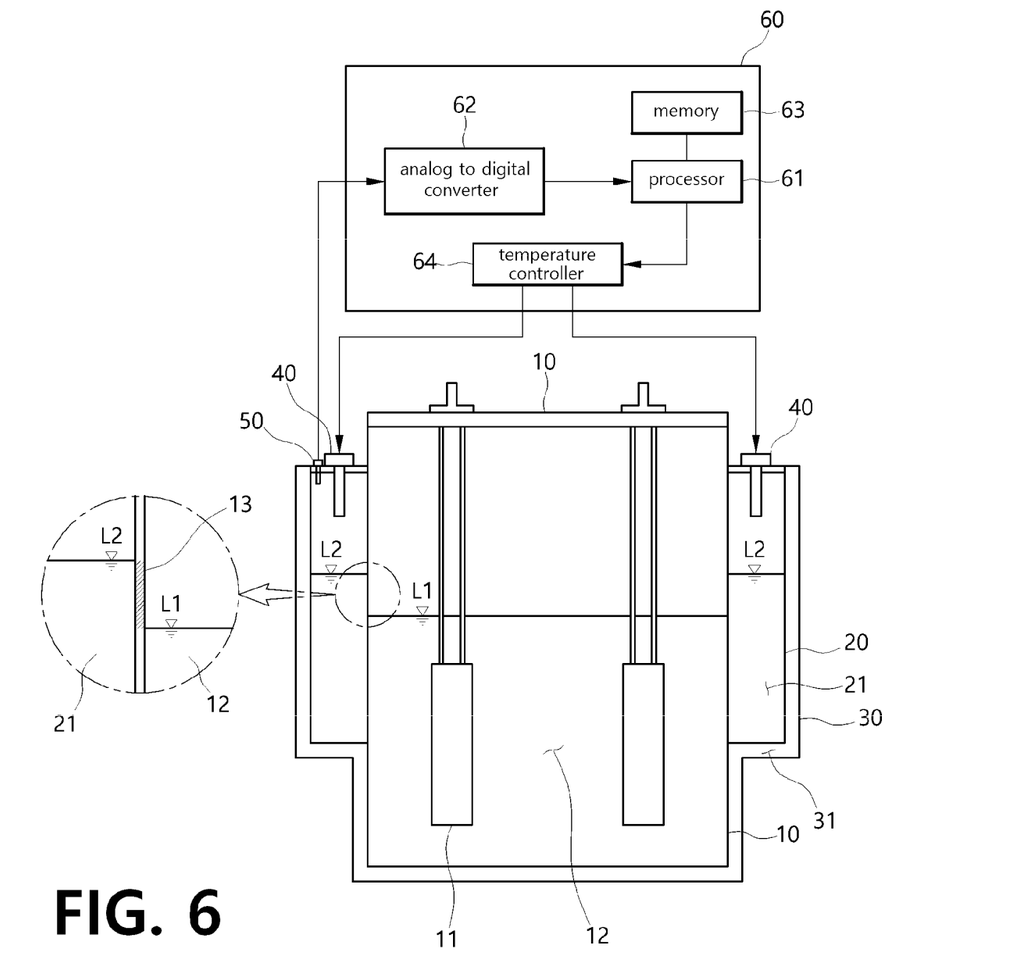

FIG. 6 is a configuration view of a cooling control device for a superconducting fault current limiter according to another embodiment of the present disclosure.

The configuration of the superconducting current restrictor shown in FIG. 6 according to another embodiment of the present disclosure comprises the first container 10, the second container 20 positioned around a portion of the outer side of the first container 10, and the third container 30 for enclosing the lateral surface and the bottom surface of the first container 10 and the second container 20 in the same manner as the example described with reference to FIG. 3.

The superconducting element 11 is accommodated in the inner accommodation space of the first container 10, and the superconducting element 11 is completely submerged in the subcooled liquid coolant 12.

That is, the liquid level of the subcooled liquid coolant 12 is positioned higher than that of the superconducting element 11.

As described above, it is suitable that the temperature of the subcooled liquid coolant 12 is about 77 K, and the space of the first container 10 at the upper side of the subcooled liquid coolant 12 is injected with a non-condensing gas to maintain the pressure of 3 bar.

When the temperature of the subcooled liquid coolant 12 is maintained at 77 K, and the pressure is 3 bar, the subcooled liquid coolant 12 is not vaporized in theory, but the pressure of the first container 10 may be increased due to the vaporization of the subcooled liquid coolant 12 due to variations in temperature or other reasons.

The pressure change in the first container 10 is a factor that changes the phase equilibrium as a whole, and the pressure needs to be maintained constantly.

Accordingly, as shown in FIG. 6, the liquid level L2 of the saturated liquid coolant 21 in the second container 20 is set to be maintained higher than the liquid level L1 of the subcooled liquid coolant 12 of the first container 10.

A portion of the outer wall of the first container 10 corresponding to the difference L2−L1 between the liquid level L2 of the saturated liquid coolant 21 and the liquid level L1 of the subcooled liquid coolant 12 becomes a region having a lower temperature than the other outer wall region, and this is referred to as the condensing surface 13.

The height of the condensing surface 13, that is, the difference between the liquid level L2 of the liquid coolant 21 and the liquid level L2 of the subcooled liquid coolant 12 becomes 5 to 30 cm.

When the height of the condensing surface 13 is less than 5 cm, the condensing effect is low, and when the height of the condensing surface 13 is more than 30 cm, unnecessary energy may be wasted.

Thus, the gaseous nitrogen, which is the subcooled liquid coolant 21 vaporized in the first container 10, condenses at the condensation surface 13, where the temperature is below the condensation temperature, liquefies again and flows into the subcooled liquid coolant 21 by gravity.

This process is repeated over and over again, thus allowing the internal pressure of the first container 10 to be maintained by re-condensing the subcooled liquid coolant 21 that has vaporized for other reasons.

As previously described, the saturated liquid coolant 21 accommodated in the second container 20 is thermally exchanged with the supper-cooled liquid coolant 12 in the first container 10, and the supper-cooled liquid coolant 12 vaporized at the condensation surface 13 is condensed and vaporized at an increased temperature.

The vaporized saturated liquid coolant 21 is condensed by the cold heads of the freezers 40, and the temperature of the saturated liquid coolant 21 and the subcooled liquid coolant 12 can be maintained and the pressure in the first container 10 can be maintained.

Although the embodiments of the present disclosure have been described above, they are merely exemplary, and those skilled in the art will understand that various modifications and equivalent embodiments are possible therefrom. Accordingly, the true technical protection scope of the present disclosure should be determined by the following claims.

INDUSTRIAL AVAILABILITY

The present disclosure relates to a technology for maintaining uniformity in temperature inside a container using natural laws and has industrial applicability.

What is claimed is:

1. A cooling control device for a superconducting fault current limiter, the cooling control device comprising:
a superconducting fault current limiter comprising:
a first container configured to accommodate a subcooled liquid coolant and a first gas with first pressure, the subcooled liquid coolant immersing a superconducting element;
a second container configured to accommodate a saturated liquid coolant and a second gas with second pressure, wherein heat exchange between the subcooled liquid coolant and the saturated liquid coolant occurs at an interface between the first container and the second container;
a freezer configured to condense the second gas, which is vaporized from the saturated liquid coolant;
an inner wall of the second container being at least a portion of an outer wall of the first container to exchange heat through the interface;
a pressure sensor for detecting a pressure of the second gas; and
a control unit configured to estimate a temperature of the saturated liquid coolant and control a temperature of the freezer based on the estimated temperature, wherein the control unit estimates the temperature by applying the detected pressure to a temperature-pressure correlation in a saturation diagram of the saturated liquid coolant.

2. The cooling control device of claim 1, wherein the control unit comprises:
- an analog-to-digital converter configured to convert a result of detecting the pressure of the pressure sensor into a digital signal;
- a processor configured to receive the digital signal of the analog-to-digital converter and estimate the temperature of the saturated liquid coolant; and
- a temperature controller configured to control the freezer of the superconducting fault current limiter under control of the processor.

3. The cooling control device of claim 2, further comprising:
- a temperature sensor directly detecting the temperature of the saturated liquid coolant, wherein
- when a difference between the temperature detected by the temperature sensor and the temperature estimated by the control unit is equal to or greater than a set value, the temperature sensor is determined to be abnormal.

4. The cooling control device of claim 3, further comprising:
- a heater for heating the subcooled liquid coolant, wherein
- the temperature controller controls the freezer and the heater to control the temperature of the saturated liquid coolant.

* * * * *